United States Patent [19]
McCoy

[11] Patent Number: 6,090,643
[45] Date of Patent: Jul. 18, 2000

[54] SEMICONDUCTOR CHIP-SUBSTRATE ATTACHMENT STRUCTURE

[75] Inventor: Dennis M. McCoy, Dallas, Tex.

[73] Assignee: Teccor Electronics, L.P., Irving, Tex.

[21] Appl. No.: 09/135,305

[22] Filed: Aug. 17, 1998

[51] Int. Cl.[7] .......................... H01L 21/44; H01L 21/48; H01L 21/50
[52] U.S. Cl. .................. 438/118; 438/106; 438/119; 438/122
[58] Field of Search .................. 438/118, 119, 438/106, 121, 122

[56] References Cited

U.S. PATENT DOCUMENTS

| | | | |
|---|---|---|---|
| 3,791,019 | 2/1974 | Schmidt | 207/473.1 |
| 3,821,614 | 6/1974 | Schmidt | 317/234 |
| 4,151,546 | 4/1979 | Kawagaie et al. | 357/71 |
| 4,258,382 | 3/1981 | Harris | 357/71 |
| 4,263,606 | 4/1981 | Yorikane | 357/71 |
| 4,413,308 | 11/1983 | Brown | 361/398 |
| 4,434,434 | 2/1984 | Bhattacharya et al. | 357/71 |
| 4,604,644 | 8/1986 | Beckham et al. | 357/80 |
| 4,649,415 | 3/1987 | Hebert | 357/74 |
| 4,650,107 | 3/1987 | Keser | 228/123 |
| 4,670,770 | 6/1987 | Tai | 357/60 |
| 4,739,917 | 4/1988 | Baker | 228/123 |
| 4,757,934 | 7/1988 | Greenstein | 228/123 |
| 4,793,543 | 12/1988 | Gainey et al. | 228/121 |
| 4,818,728 | 4/1989 | Rai et al. | 437/209 |
| 4,903,118 | 2/1990 | Iwade | 357/72 |
| 4,961,528 | 10/1990 | Peters | 228/123 |
| 5,150,197 | 9/1992 | Hamburgen | 357/80 |
| 5,234,865 | 8/1993 | Goebel et al. | 437/209 |
| 5,340,435 | 8/1994 | Ito et al. . | |
| 5,838,063 | 11/1998 | Sylvester . | |

OTHER PUBLICATIONS

Paper—SA 100 Series—Surge Arrestors © 1994 SGS—Thomson Microelectronics.

"Double Pedestal Cell Outline," Drawing No. 4101537; Apr. 22, 1991 (Teccor).

"Cell Outline," Drawing No. 4101055; Aug. 13, 1987 (Teccor).

*Primary Examiner*—Kevin M. Picardat
*Assistant Examiner*—D. Mark Collins
*Attorney, Agent, or Firm*—Roger N. Chauza

[57] ABSTRACT

A semiconductor device soldered to a conical mounting pedestal of a metal substrate reduces the lateral shearing stress created by temperature changes. An angle between the bonding surfaces of the semiconductor device and the metal substrate can be selected as a function of the coefficients of thermal expansion of the device and substrate material.

15 Claims, 3 Drawing Sheets

SEMICONDUCTOR CHIP-SUBSTRATE ATTACHMENT STRUCTURE

TECHNICAL FIELD OF THE INVENTION

The present invention relates in general to techniques for mounting semiconductor devices to substrates, and more particularly to a technique that reduces adverse mechanical stresses between the device and the substrate caused by changes in temperature.

BACKGROUND OF THE INVENTION

Electrical semiconductor devices in the form of a "die" are generally mounted on a substrate during the final stages of assembly. It is generally known that a substantially planar bottom surface of an electrical semiconductor device can be mounted to a substantially planar top surface of the substrate by the use of a mechanical bonding agent, such as solder. The substrate provides mechanical support for the electrical device, and may be utilized to connect the electrical device to a ground potential. Various surface structures are known to be used when mounting a semiconductor device to a substrate. For instance, the substrate surface may possess finely dimpled, abraded areas, or grooves to assist with mechanically securing the electrical component to the substrate.

Typically, the semiconductor device or die is fabricated with silicon, germanium, galium arsenide, or other similar material. The substrate is usually constructed of a metal or ceramic material. The substrate material is generally selected for thermal conduction properties to efficiently transfer the heat from the semiconductor material to the substrate. The heat is dissipated from the substrate via pins, heatsink structures, or to the atmosphere.

Because many semiconductor devices generate heat as a result of current passing through resistive paths, such heat must be dissipated in a manner that does not adversely affect the long-term reliability of the device. The heat generated within the device is not the only source of heat, as heat applied to chips during soldering processes can also damage the structures. If the temperature changes are substantial and the two materials are of vastly different thermal coefficients of expansion, the parts undergo stress either during the heating stage or the cooling stage, or both.

Lastly, internal thermal energy can be applied to devices by externally applied electrical currents, such as in the case with overvoltage or overcurrent protection devices. An overvoltage caused by lightning or a power line cross can cause substantial current to flow through the protective devices. The large currents can cause a significant amount of heat within the devices, and can cause mechanical or physical destruction, especially in semiconductor chips that are soldered to metal or ceramic substrates. Because of the differing thermal expansion characteristics of such electrical devices, the mechanical shock caused by the thermal heating of the device can cause stresses in the material of such a magnitude that can crack or break the components.

During electrical operation of the semiconductor device, the temperature of the electrical semiconductor device rises, and often significantly, due to the $I^2R$ losses. As the temperature of the electrical semiconductor device increases, the temperature of the solder and the substrate will also increase. As a result, the solder will expand and the physical size and shape of both the electrical semiconductor device and the substrate may change. It is of critical importance that the thermal stresses experienced do not damage either the semiconductor die or the substrate. However, because different materials are selected to achieve the vastly different purposes, there generally exists a significant difference in the thermal coefficients of expansion of the materials. With the different expansion of solder as well as the deformation of the semiconductor device and the substrate, mechanical stresses are created between the substrate and the semiconductor device. The degree of material expansion between the semiconductor material and the substrate increases with increasing temperature.

Various attempts have been made to reduce the effects of mechanical stresses between semiconductor dies attached to substrates. U.S. Pat. No. 5,150,197 discloses a technique for distributing the stress between a semiconductor die and a substrate having a solder joint therebetween. According to the patent, a more uniform temperature distribution is achieved when the solder joint varies in thickness, with the thicker portion being near the edge of the semiconductor chip, and thinner near the center of the chip where the temperature generated by the chip is the greatest. With this arrangement, the stress in the solder joint is minimized. Also, the substrate was formed with a central pedestal that either had rounded corners, or had a convex surface on which the chip was mounted. Because of the contoured or curved profile and shape of the substrate pedestal, and the corresponding shape of the solder therebetween, the stress vectors between the substrate and the semiconductor chip are not all unidirectional. Rather, due to the curvature in the solder connection, thermal stresses yet exist in the semiconductor chip when the substrate expands. However, there is no suggestion in the patent of how to reduce the stresses in the attachment of different materials, based on the particular materials involved and the temperature range involved.

It can be seen from the foregoing that a need exists for a better technique in attaching a semiconductor chip to a non-semiconductor substrate so as to further reduce the stresses induced therein when subjected to temperature changes. Another need exists for a method for ascertaining to a high degree of reliability the optimum surface shape between a semiconductor chip and a substrate, based on the particular thermal coefficients of expansion thereof.

SUMMARY OF THE INVENTION

In order to reduce the physical stresses between semiconductor devices and the substrates to which they are attached, one object of the present invention is to mount the device on a conical shaped pedestal portion of the substrate. The conical pedestal has a flat top surface with a substantially uniform declining slope from a center area to the edge of the substrate. That is, the declining slope of the mounting surface extends in a substantially uniform manner from a high point at the center of the substrate to a lower exterior edge of the side portion of the substrate. If an appropriate angle is chosen for the substantially uniform declining slope, the lateral stresses of expansion between the materials during a temperature cycle are greatly reduced.

Various pedestal shapes may be chosen, which preferably include a smooth conical structure. The center of the substrate pedestal may also include a pointed apex or a small flat mounting surface near the center to facilitate assembly and mounting of the semiconductor device to the substrate. If the small flat mounting surface near the center is employed, a substantially uniform declining slope preferably extends from the edge of the flat region to the lower exterior edge of the side portion of the substrate. The conical-shaped surface is necessary only on that portion of the pedestal where solder flows to attach the parts together.

When the semiconductor device is mounted on the conical pedestal, the solder filled therebetween exhibits stress vectors that are all vertical, thus reducing thermal stresses in the materials. In accordance with an important feature of the invention, the angle between the underside of a semiconductor chip and the conical surface of the substrate pedestal is calculated as a function of the thermal coefficients of expansion of the materials. Thus, the angle can be selected to ideally achieve the minimum stress induced into the structure as a result of temperature cycling of the device.

BRIEF DESCRIPTION OF THE DRAWINGS

Further features and advantages will become apparent from the following and more particular description of the preferred and other embodiments of the invention, as illustrated in the accompanying drawings in which like reference characters generally refer to the same parts or elements throughout the views, and in which.

DETAILED DESCRIPTION OF THE INVENTION

Figure 1:
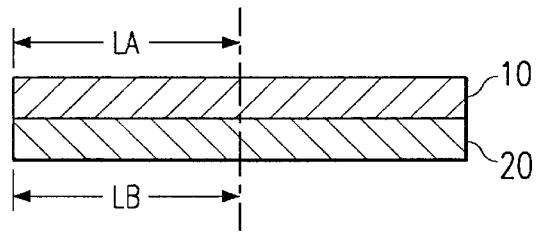
FIG. 1 is a cross-sectional view of a prior art semiconductor device mounted on a substrate.

FIG. 1 illustrates a cross-sectional view of a copper substrate and a semiconductor device bonded together at a solder interface. In this standard mounting technique, a semiconductor device 10 with a bottom planar surface is mounted directly on the top planar surface of the substrate 20. Generally, there is an intimate contact of the materials between the area of contact. The semiconductor device 10 is mechanically supported by the substrate 20, which may also electrically connect the semiconductor device 10 to a ground potential.

In order to understand the thermal stresses to which such a structure is subjected, the following is submitted. In the following description, the letter A denotes the semiconductor device 10, and the letter B denotes the substrate 20. From the central point of the semiconductor device 10, a distance of LA is measured to the peripheral edge thereof. From the central point of the substrate 20, a distance of LB is measured to the peripheral side edge thereof. Typically, the semiconductor device 10 is mounted on the substrate 20 with solder or another type of bonding adhesive that solidifies. The bonding material generally attaches the materials together in a rigid manner. The adhesive material or solder is omitted from the FIGS. 1–3 to simplify the description of the effects of deformation of both the semiconductor device and the substrate during operation. It is important to understand that because of the bonding attachment of the device 10 along a substantial surface area thereof to the substrate 20, the degree of expansion/contraction of one material will impart a lateral force to the other material in attempt to force the same degree of dimensional change. In other words, the material with a lower coefficient of thermal expansion will attempt to constrain the other material with the greater coefficient of expansion, and the other material will attempt to stretch the material having a smaller coefficient of expansion. When both materials are subjected to these stresses, one will generally dominate. The more rigid material generally dominates, and causes the other material to conform dimensionally to any change in length. In the example, the substrate is constructed of copper, which has a coefficient of thermal expansion substantially greater than that of a semiconductor material.

Figure 2:
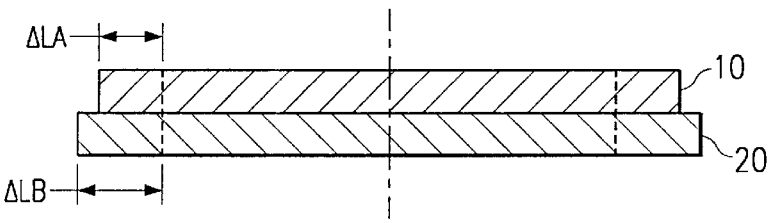
FIG. 2 is a cross-sectional view of a prior art semiconductor device mounted on a substrate, after experiencing a change in temperature of the materials.

As the semiconductor device operates, the temperature thereof rises and causes a thermal expansion of the semiconductor material which, in turn, causes an expansion of the substrate 20. Because the heat is generated in the semiconductor device 10, it generally expands at a rate different from that of the substrate 20. As shown in FIG. 2, the change in length due to the lateral expansion of the semiconductor device 10 is designated ΔLA. The change in length of the substrate 20 due to temperature changes is designated as ΔLB. ΔLA will not generally equal ΔLB in the situation where the thermal expansion of the semiconductor device 10 is lower than the thermal expansion of the substrate 20. The differences in expansion rates and amounts of expansion is known to cause many physical stresses between the electrical semiconductor device 10 and the substrate 20. Although the semiconductor device 10 and the substrate 20 also expand in thickness, this dimensional change is not as great as the lateral dimensional change. Moreover, there is less of a constraining attachment between the two materials in the vertical direction. The materials are thus free to accommodate changes in thickness without affecting each other to the extent that reliability is a concern.

According to an important feature of the present invention, the physical stresses created by the thermal expansion of the semiconductor device 10 and the substrate 20 are reduced by forming the top surface of the substrate 20 as a conical pedestal. As shown in the cross-sectional view of FIG. 3, the top surface of the substrate 20 is fabricated with a substantially uniform declining slope from the center thereof to the side edge of the substrate. By forming the top surface of the substrate 20 with a substantially uniform declining slope in the nature of a three-dimensional cone, the effects of temperature changes of the two different materials are reduced. In addition, by forming the angle α between the conical substrate surface and the lower surface of the semiconductor device 10 as a function of the thermal expansion coefficients of the materials, the amount of lateral expansion ΔLB (in the X direction) of the substrate 20 will be close to the lateral expansion ΔLA of the semiconductor device 10. It is understood that the direction of material expansion of concern of the semiconductor device 20 is in the X-direction, whereas the substrate 20 has a component of expansion in both the X and Y directions, due to its angled nature. Stated another way, even though the longitudinal component of expansion of the substrate 20 in an angled direction will be different from the semiconductor device 10, the lateral component ΔLB of expansion of the substrate 20 will more closely match the lateral expansion ΔLA of the semiconductor device 10. Accordingly, the declining slope is instrumental in matching the different lateral material expansion rates between the substrate 20 and the semiconductor device 10. It is realized that the angled region between the substrate 20 and the semiconductor device 10 would in practice be filled with solder or other suitable bonding adhesive. As a practical matter, the angle α is only important to the surfaces between the device 10 and the substrate to which the bonding material is applied. The surface shape or angle of those parts of the materials that are not directly bonded together is generally irrelevant.

Figure 3:
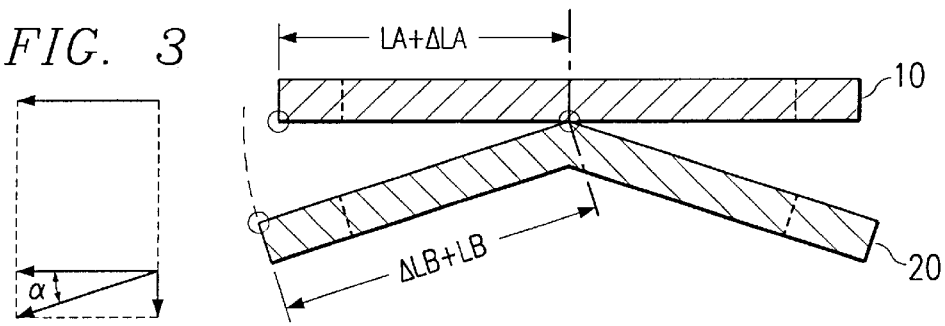
FIG. 3 is a cross-sectional view of an electrical semiconductor device mounted on a substrate having an angled mounting pedestal.

Viewed in a different light, when the above-referenced angle between the bonding surfaces is correct, the length of the vector of lateral expansion of the semiconductor material 10 is equal to the length of the vector of the lateral component of expansion of the substrate 20. This is shown in FIG. 3. When these vectors are of substantially equal length, the different expansion rates of the different materials is inconsequential and stresses therebetween are minimized. If the angle α is too small, the lateral vector component of the substrate 20 will be greater than that of the semiconductor device 10, and stresses therebetween can be significant. Conversely, if the angle α is too large, the lateral vector component of the substrate 20 will be less than that of the semiconductor device 10.

It is also realized that reducing the amount of direct physical contact area between the semiconductor device 10 and the substrate 20 will also reduce the mechanical stresses between the devices. This reduces the extent by which one material is constrained to the other material. Thus, the angled interface assists with reducing the stresses by reducing the amount of stress transferred from one material to the other material.

Using an actual example of materials, silicon is a semiconductor material that has a relatively low thermal expansion rate ($2.23 \times 10^{-6}$ inch/inch/C.°), whereas conventional package substrates, such as copper, possess a relatively high thermal expansion rate ($16.5 \times 10^{-6}$ inch/inch/C.°). As noted above, during electrical operation of the semiconductor device 10, its body temperature rises in proportion to the wattage dissipated in the material. The rising temperature of the silicon device 10 and a transfer of the thermal energy to the substrate 20 causes a thermal expansion of both the silicon device and the copper substrate. This thermal expansion is greatest in the lateral direction. Because the lateral expansion rate for the copper substrate 20 is greater than the lateral expansion rate for silicon semiconductor material 10, this mismatch of the expansion rates will cause extreme physical stresses between the two materials. If the physical stresses between the materials is excessive, one or both materials can fail, thereby reducing the reliability of the device. Indeed, if the device is subjected to frequent temperature cycling, the physical stresses can fatigue the materials and cause eventual failure thereof.

In practice, a suitable adhesive is placed between the semiconductor device 10 and the substrate 20 to mechanically bond the parts together. As the temperature of the semiconductor device 10 increases, the temperature of the adhesive also increases. Therefore, a second physical stress is placed on the device-substrate interface with the expansion of the adhesive. If the interface between the semiconductor device 10 and the substrate 20 is in a planar relationship as shown in FIG. 1, the expansion of the adhesive can cause further lateral shearing stresses, especially if the bonding adhesive solidifies to a rigid state. Again, these lateral stresses can be reduced when the top surface of the substrate 20 is formed with a substantially uniform declining slope as shown in FIG. 3.

Figure 4A:
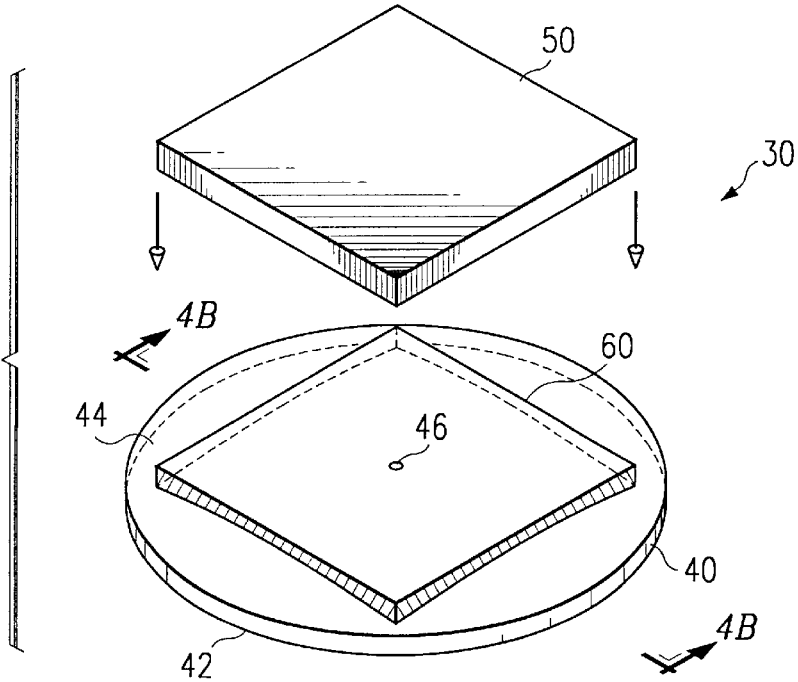
FIG. 4A is an isometric and exploded view of the mounting of a semiconductor device on a substrate incorporating a conical pedestal.
Figure 4B:
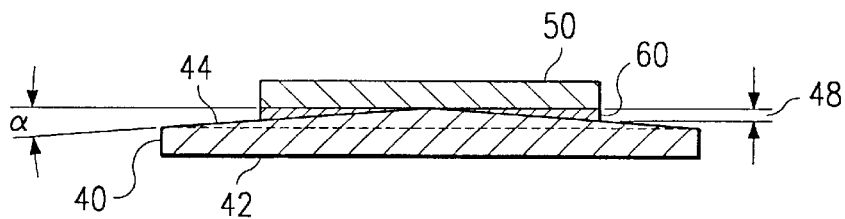
FIG. 4B is a cross-sectional view taken along line 4B—4B of FIG. 4A, showing a semiconductor device mounted on a substrate having a conical pedestal.

The device-substrate assembly 30 is shown in FIGS. 4A and 4B where a conical-shaped substrate 40 supports a semiconductor device 50. An adhesive alloy, such as solder 60, mechanically bonds the substrate 40 to the semiconductor device 50. The substrate 40 has a bottom surface 42 and a top surface 44. An apex 46 of the cone-shaped surface at or near the center of the substrate 40 provides the high point for the declining slope to the side edge of the substrate 40. It is noted that the substrate need only be conical shaped in the area where it is expected that the solder will attach to both the semiconductor device 50 and the substrate 40. Outside this bonding area, the shape or surface contour of the substrate is of less concern.

As shown in FIG. 4A, the top surface 44 slopes downwardly from the peak 46 toward the peripheral edge in a substantially uniform fashion. The top surface 44 is fabricated with a geometrical conical shape from the apex 46 at the center, to the side edge of the substrate 40.

FIG. 4B shows the cross section of the assembly 30 taken along line 4B—4B of FIG. 4A. The cross-sectional diagram of the assembly 30 is shown with the semiconductor device 50 mounted on the top conical-shaped surface 44 of the substrate 40 with an adhesive solder 60. The angle α is shown in FIG. 4B relative to the bottom surface of the electrical semiconductor device 50 and the declining slope of the top surface 44 of the substrate 40. The distance between the top surface 44 of the substrate 40 and the bottom surface of the semiconductor device 50 at the peripheral edge thereof is defined by the dimension 48.

The angle α can be accurately determined based on the coefficients of thermal expansion of the various materials. Using the formula $\Delta L = (CTE)(\Delta T)L$, the difference in lateral expansion of the substrate 40 and the electrical semiconductor device 50 is determined by the product of the coefficient of thermal expansion (CTE) and the temperature differential (ΔT), times the length (L) that is common to the attachment area between the materials. Preferably, the temperature differential ΔT is the difference between the maximum and minimum temperature to which the assembly 30 is exposed. The parameter L in this formula is the length of the semiconductor device 50 or the substrate 40, whichever is shorter. This assumes that a bonding agent is applied along the entire surface area of the shorter material. Once the parameter ΔL is defined, the angle of the declining slope α is obtained by the following formula:

$$\alpha = \text{ARC COS}\ ((\Delta LA + L)/(\Delta LB + L))$$

Using this formula, an optimum declining slope between the conical top surface 44 of the substrate 40 and the semiconductor device 50 is defined by the ARCCOS of the result of the expanded length of the semiconductor device, plus the length L, divided by the expanded length of the substrate, plus the length L. Accordingly, the angle α is dependent upon the thermal expansion coefficient of the substrate 40, the thermal expansion coefficient of the semiconductor device material 50, the expected temperature differential, the expanded length of the substrate 40, and the expanded length of the semiconductor device 50.

Figure 5A:
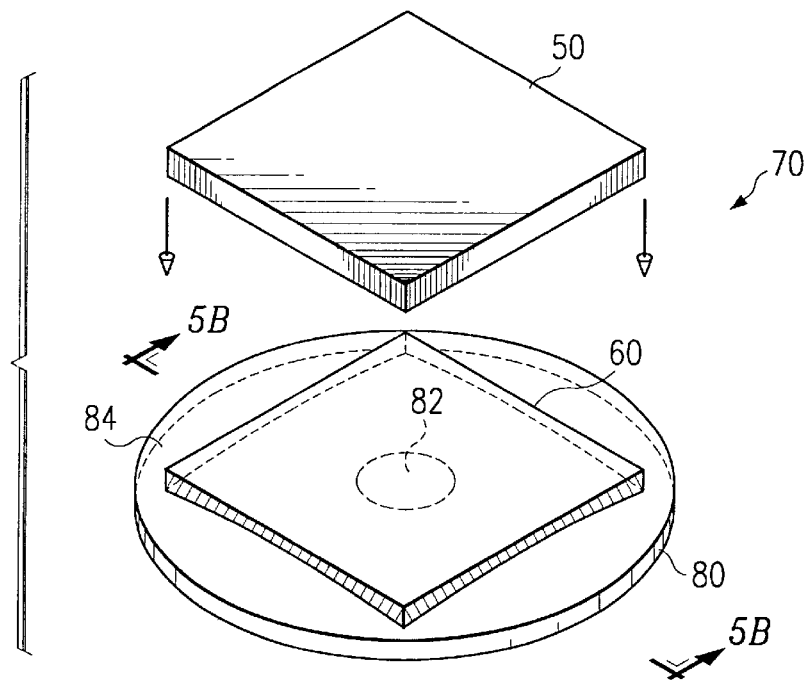
FIG. 5A is an isometric and exploded view of the mounting of a semiconductor device on the top flat surface of a conical pedestal.
Figure 5B:
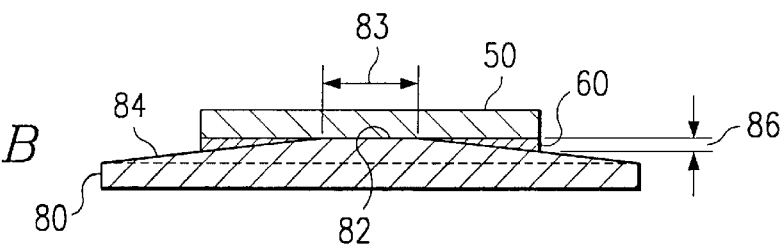
FIG. 5B is a cross-sectional view taken along line 5B—5B of FIG. 5A, showing the flat mounting surface on the conical pedestal for mounting thereto the semiconductor device.

Another assembly 70 is shown in FIG. 5A where a substrate 80 supports the semiconductor device 50. Solder is formed or otherwise disposed between the substrate 80 and the semiconductor device 50. Instead of forming the substrate 80 having a center reaching an apex, as set forth above in connection with FIG. 4A, the conical pedestal is provided with a substantially flat region 82 on the top surface 84 of the substrate 80. This flat region 82 facilitates the assembly of the components by providing a substantially flat surface 82 on which the semiconductor device 50 is mounted during fabrication. This flat mounting surface 82 assists with alignment of the electrical semiconductor device 50 with respect to the substrate 80. The flat mounting of surface 82 occupies only a portion of the surface area of the semiconductor device 50. As shown in FIG. 5B, the diameter of the flat mounting surface 82 of the preferred embodiment is identified with reference numeral 83, and is approximately 30 mils in diameter. The diameter of the substrate 80 is about 160 mils, and the semiconductor device 50 is about 75 mils square. The diameter 83 of the flat surface is preferably maintained as small as practical, it being realized that the flat surface 82 facilitates a stable orientation of the semiconductor device 50 on the substrate 80 during the solder process. Since there is a very thin solder attachment of the materials at the flat mounting surface 82, a small amount of stress is not corrected by the use of an angled mounting pedestal. Except for the top flat mounting surface 82, the assembly is the same as shown in FIG. 4A.

FIG. 5B shows a cross section of the assembly 70 taken along line 5B—5B of FIG. 5A. The cross-sectional diagram of the assembly 70 is shown constructed with an electrical semiconductor device 50 mounted on the top flat surface 82 of the substrate 80 with an adhesive solder 60. The angle $\alpha$ of the declining slope of the top surface 84 of the substrate 80 is defined by the top surface of the substrate 80 (edge portion of substrate 80 to the edge of the flat surface 92) and the bottom surface of the semiconductor device 50. The vertical gap between the top surface 84 of the substrate 80 and the bottom surface of the semiconductor device 50 at the peripheral edge of the electrical semiconductor device 50 is defined by the dimension 86.

The angle $\alpha$ is calculated by the same formula provided above except that the length L is measured from the edge of the flat mounting surface 82 to the edge of the semiconductor device 50. This formula will depend on the amount of space utilized to provide for the flat mounting surface 82.

Figure 6:
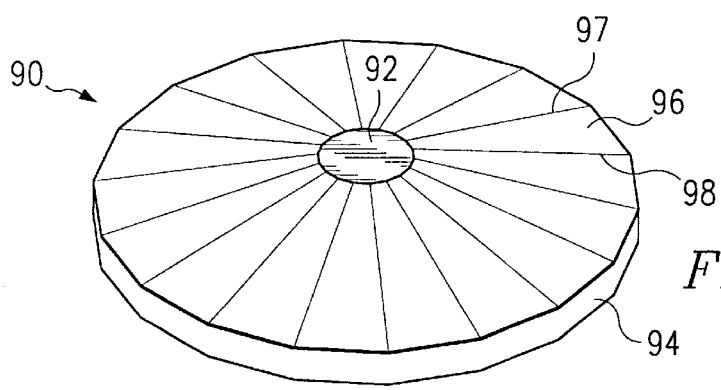
FIG. 6 is an isometric view of a conical-shaped pedestal of the type having facets.

An alternate embodiment is shown in FIG. 6. Here, the conical top surface also declines in a substantially uniform fashion from the edge of the flat mounting surface 92 to the edge of the substrate 94. However, the top surface of the substrate 94 is formed by repeating the formation of a flat facet region 96 about the top surface of the substrate 94. Each facet region 96 is joined by sloping edges 97 and 98, and each region 96 extends in a declining slope from the flat mounting surface 92 to the lower edge of the substrate 94.

Figure 7:
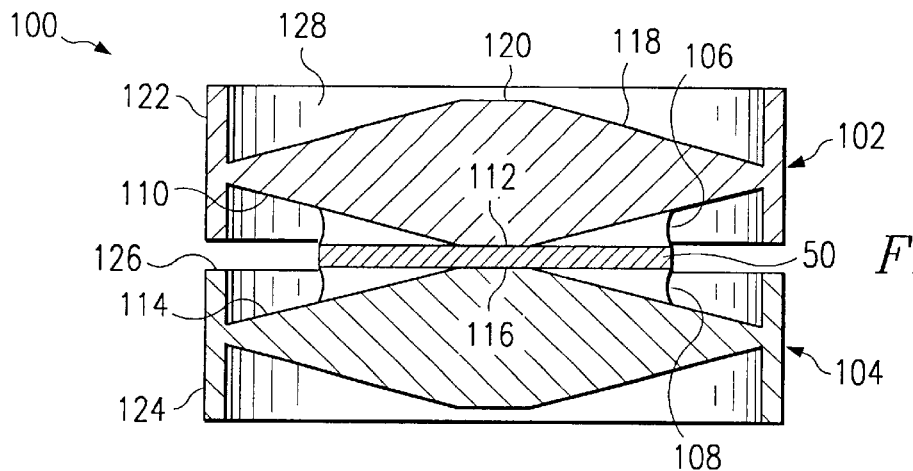
FIG. 7 is a cross-sectional view of an assembly constructed in accordance with the preferred embodiment of the invention.
Figure 8:
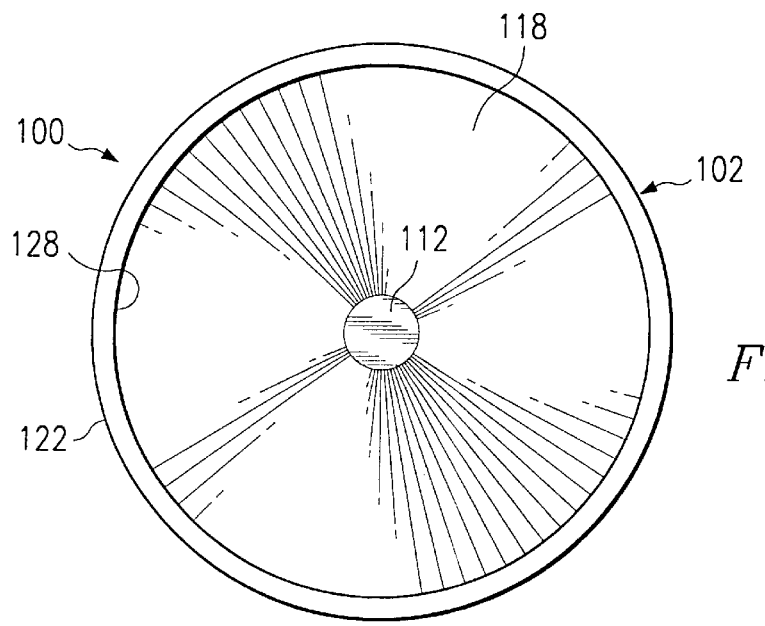
FIG. 8 is a top view of the semiconductor-substrate assembly of FIG. 7.

FIG. 7 is a cross-sectional view of a semiconductor-substrate assembly 100, constructed in accordance with the preferred embodiment of the invention. FIG. 8 is a top view of the symmetrical substrate of FIG. 7. The assembly 100 includes a top metal substrate 102 and a bottom metal substrate 104, both identically constructed of a nickel-plated copper. A semiconductor chip 50 is soldered to the top substrate 102 by an annular-shaped solder fillet 106. Additionally, the semiconductor chip 50 is soldered to the bottom substrate 104 by a similar annular-shaped fillet 108. Much like the substrate described in connection with FIGS. 4A and 4B, the substrates 102 and 104 each include conical-shaped pedestal mounting surfaces. The substrate 102 includes a conical-shaped mounting pedestal 110, terminating at a flat mounting surface 112, to which the semiconductor chip 50 is mounted by the solder fillet 106. Similarly, the substrate 104 includes a conical-shaped bonding surface 114, also having a flat mounting surface 116 to which the bottom side of the semiconductor chip 50 is mounted by way of the solder fillet 108. The angle $\alpha$ by which the conical-shaped bonding surfaces 110 and 114 form with respect to the planar top and bottom surfaces of the semiconductor chip 50, minimizes the adverse effects caused by the different expansion rates of the materials.

In accordance with an important feature of the invention, both substrates 102 and 104 are not only identical, but are constructed in a symmetrical manner so as to facilitate stacking of the assemblies in an array. For example, the substrate 102 includes a top conical bonding surface 118 terminating in a flat mounting surface 120 to accommodate another semiconductor chip (not shown). Such other chip can be sandwiched between the substrate 102 and yet another identically-shaped substrate (not shown) to provide two chips connected in a series, stacked manner. When stacked in the manner shown in FIG. 7, the vertical dimensions of the respective rims 122 are such that a gap 126 exists therebetween. This prevents the arcing of large voltages between the metallic substrates 102 and 104, which would otherwise short circuit the semiconductor chip 50. The circumferential rim 122 of the substrate 102 includes upper and lower annular hollowed out portions, one shown as reference numeral 128.

In the preferred form of the invention, the semiconductor chip 50 is constructed as a device that functions as a high-voltage protection circuit. In circuits to be protected from high voltages, such as caused by power line crosses or lightning, the sidactor device will trigger at 200–300 volts and carry substantial currents therethrough. These currents create substantial heat which, if not properly taken into consideration, can cause severe material stresses between the metal substrates and the semiconductor chip. In practice, the diameter of the substrate 102 is no more than about 5/16 inch, and a chip can carry tens of amps of current for short durations without failing. It can be appreciated that when the assembly undergoes numerous overvoltage conditions, and thus temperature cycles, the physical stresses between the different materials must be accounted for and minimized. It has been found that by utilizing the conical-surface mounting pedestal, the assemblies are much more reliable.

The foregoing sets forth a technique for matching a common component of thermal expansion of different materials that are attached together. While the preferred embodiment describes the technique in conjunction with a planar semiconductor material and a conical shaped mounting pedestal, other variations are also well within the ambit of the invention. For example, there is no requirement or necessity that the semiconductor or corresponding component be linear or planar. Rather, such component may also include a conical shaped mounting surface which exhibits both a horizontal and vertical vector component of an expansion/contraction characteristic. Again, if the angle between the conical surface of the semiconductor device and the conical surface of the substrate is selected so that the respective horizontal vector components are matched, then the adverse effects of temperature changes are minimized.

Figure 9:
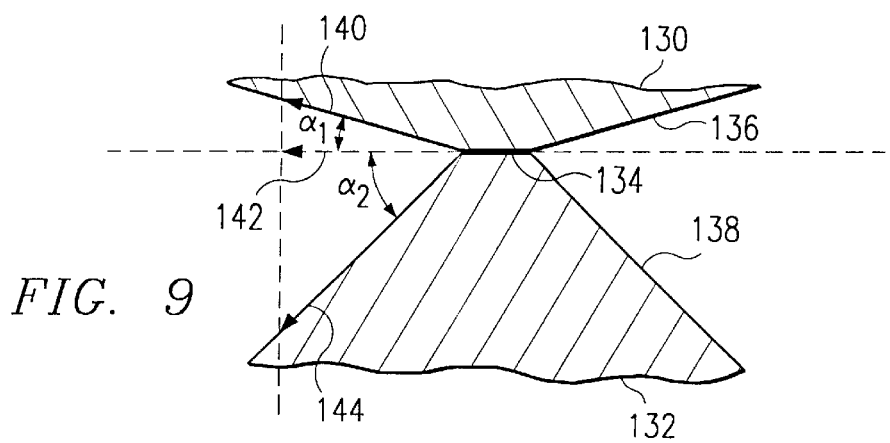
FIG. 9 is a partial cross-sectional view of a semiconductive device and substrate embodiment, where each is constructed with a conical-shaped mounting pedestal.

The preferred embodiment has been described in connection with a linear or planar semiconductor device attached to a substrate so as to form an angle therebetween. However, the principles and concepts of the invention are equally applicable to different materials attached together, neither of which is planar. FIG. 9 shows such an example in which a first material 130 is attached to a second material 132 at a flat mounting interface 134 therebetween. However, neither material 130 or 132 is planar, at least at the attachment interface such as shown by reference numerals 136 and 138. It is assumed that the annular space bounded by the opposing surfaces 136 and 138 would be filled with a bonding agent so as to rigidly attach the materials 130 and 132 together. Because the materials 130 and 132 can be of vastly different compositions, the coefficient of thermal expansion of each material is different, and thus must be accounted for so as to minimize the adverse effect of temperature changes.

For purposes of the example, it is assumed that the angle $\alpha_1$ with respect to a horizontal reference line is fixed and cannot be changed. Taking into consideration the expansion vector 140 of the material 130, there will necessarily be a corresponding horizontal vector component 142. It should be understood that the expansion vector 140 is shown coplanar with the attachment surface, but this may not necessarily be the case. Indeed, depending upon the shape of the material 130, the expansion vector 140 may indeed be represented by a phantom vector that is located within the material itself. A rigorous materials analysis can be carried out to determine the extent and direction of the expansion vector 140.

With regard to the other material 132, and taking into consideration the corresponding coefficient of thermal expansion, the angle $\alpha_2$ can be determined between the corresponding expansion vector 144 and the horizontal reference, it being understood that the horizontal vector component 142 is known, as is the expansion vector 144 of the second material 132. What is important to consider is that the angle $\alpha_2$ be found such that the expansion vector 144 of the second material 132 has a horizontal component that is identical to the horizontal component of the expansion vector 140 of the first material 130. When this criteria is satisfied, the difference in thermal expansion rates between the two materials 130 and 132 becomes inconsequential and any adverse thermal effects thereof are minimized.

While the foregoing has been described in connection with each of the materials being homogeneous, the principles of the invention can nonetheless be utilized if one workpiece were made of different materials. In this event, there may be different angles involved in the attachment of one workpiece to the other workpiece.

While various materials are used to describe the present invention, the objectives achieved by this invention would be applicable to any adhesive bonding element which expands under thermal stress, or to any substrate material which thermally expands or contracts at a different rate than the semiconductor device. For instance, while a solder alloy is used to describe the preferred embodiment, the present invention is not restricted or limited to solder. In fact, any adhesive substance utilized to create a bond between the semiconductor device and the substrate should be considered fairly within the scope of the invention. Thus, the present invention is not limited to the preferred embodiment, but is defined by the claims as set forth below.

What is claimed is:

1. A method of fixing a first material to a second different material to minimize effects of temperature changes, comprising the steps of:

forming at least one of the first or second materials with a conical mounting pedestal;

selecting an angle between a bonding surface of the conical mounting pedestal and a bonding surface of the other material as a function of the thermal coefficients of expansion of said first and second materials; and fixing the first material to the second material with a bonding material applied between the respective bonding surfaces.

2. The method of claim 1, further including forming the conical mounting pedestal on the material having the greater thermal coefficient of expansion.

3. The method of claim 1, further including forming a flat surface at a tapered end of the conical mounting pedestal.

4. The method of claim 1, wherein said first material comprises a semiconductor material, and said second material comprises a metal substrate, and further including forming a pair of metal substrates each having a conical mounting pedestal, and fixing the semiconductor material between the two conical mounting pedestals.

5. The method of claim 4, further including forming each metal substrate so as to be shaped.

6. The method of claim 4, further including forming an annular rim on each metal substrate, and wherein a rim of one metal substrate is spaced from the rim of the other metal substrate.

7. A method of mounting an electrical device to a substrate, comprising the steps of:

providing said substrate with a conical-shaped mounting pedestal having a substantially uniform declining slope;

placing the electrical device adjacent the slope of said conical-shaped mounting pedestal;

placing a bonding agent between at least a portion of the slope of said conical-shaped mounting pedestal and said electrical device; and allowing said bonding agent to harden to thereby secure said electrical device to said substrate, whereby said electrical device and said substrate experience reduced material stress therebetween when exposed to temperature changes.

8. The method of claim 7, further including determining an angle between the substantially uniform declining slope of said mounting pedestal and the electrical device as a function of the rate of thermal expansion of said substrate.

9. The method of claim 7, further including determining an angle between the substantially uniform declining slope of the mounting pedestal and the electrical device as a function of the rate of thermal expansion of the electrical device.

10. The method of claim 7, further including determining an angle between the substantially uniform declining slope of the mounting pedestal and the electrical device as a function of the temperature coefficients of both the substrate and the electrical device.

11. The method of claim 7, wherein said declining slope comprises a number of contiguous segmented facet regions separated by edges extending to a side portion of the substrate.

12. The method of claim 7, wherein said mounting pedestal has a substantially flat mounting surface for said electrical device.

13. The method of claim 7, wherein the declining slope of said mounting pedestal has an apexed point.

14. The method of claim 7, wherein the declining slope of said conical-shaped mounting pedestal is symmetrical in shape.

15. The method of claim 1, further including selecting an angle $\alpha$ by using the formula $\alpha = \text{ARC COS}((\Delta L_1 + L)/(\Delta L_2 + L))$, where the change in length of the first material after a temperature change is $\Delta L_1 = (CTE_1)(\Delta T)L$, and L equals a length of common bonding surface between the two materials prior to any temperature change, $CTE_1$ equals the coefficient of thermal expansion of the first material $L_1$, $\Delta T$ equals the expected range of temperature change, where the change in length of the second material after a temperature change is $\Delta L_2 = (CTE_2)(\Delta T)L$, and $CTE_2$ equals the coefficient of thermal expansion of the second material $L_2$.

* * * * *